March 26, 1963 F. A. SCHUMACHER 3,083,248
THERMOELECTRIC MODULE
Filed July 28, 1961
FIG. 1
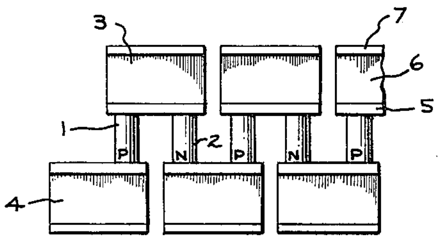
FIG. 2
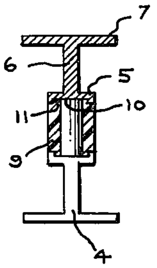
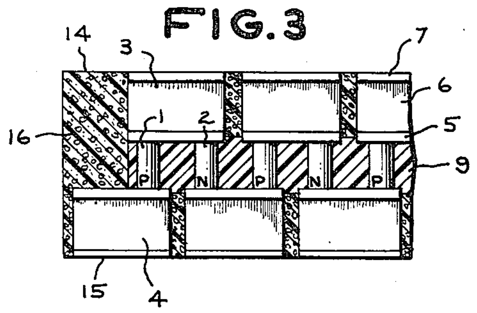
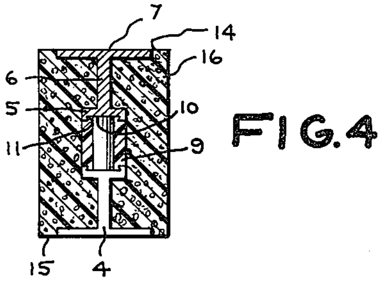
FIG. 4
INVENTOR.
FRANK A. SCHUMACHER
BY Walter E. Kule
HIS ATTORNEY United States Patent Office 3,083,248

Patented Mar. 26, 1963

3,083,248

THERMOELECTRIC MODULE

Frank A. Schumacher, Louisville, Ky., assignor to General Electric Company, a corporation of New York Filed July 28, 1961, Ser. No. 127,526
2 Claims. (Cl. 136—4)

The present invention relates to thermoelectric heating or cooling devices and is particularly concerned with an improved thermoelectric module for use in such devices.

Thermoelectric devices employed for heating or cooling frequently comprise a number of individual thermoelectric modules or units each comprising a plurality of pairs of dissimilar thermoelectric elements. The individual units or modules are assembled and electrically interconnected as required to provide the desired heating or cooling power for the device. To prevent breakage of the joints between the individual thermoelectric elements and the junction forming members soldered thereto, it is desirable to design each of the individual modules as rigid strong sub-assemblies so that the relatively fragile elements and the joints are protected from excess mechanical stresses both during manufacture and use of the modules.

It is an object of the present invention to provide a new and improved thermoelectric module particularly of a novel design adapted to protect the thermoelectric elements and their joints from breakage during normal handling of the modules.

Further objects and advantages of the invention will be apparent from the following description thereof and the features of novelty which characterize the invention will be pointed out with particularity in the claims annexed to and forming part of this specification.

In carrying out the objects of the present invention, there is provided a thermoelectric module comprising spaced, substantially parallel heat absorbing and heat dissipating surfaces and a plurality of dissimilar thermoelectric elements, that is P-type and N-type elements, disposed in the space between the surfaces and extending substantially perpendicular to the surfaces. In each module, the P- and N-type elements are arranged alternately and in a substantially straight line, that is, in the same plane. Junction forming members soldered to the ends of the P- and N-type elements are provided for connecting the dissimilar elements alternately and in series so that when a direct current is passed through the series connected elements there is formed a set of hot junctions and a set of cold junctions. In order to provide sufficient spacing between the heat absorbing and heat dissipating surfaces of the module, each of the junction forming members includes a base portion which is directly soldered to the thermoelectric elements and a heat conducting portion extending to or through one of the surfaces. For the purpose of strengthening the soldered joints between the elements and the junctions forming members and also to protect the elements themselves from breakage, the joined elements are encapsulated in a body of solid resinous material extending the entire lengths of the elements and anchored to the opposed base portions of the junction forming members in such a manner that this body of resinous material rigidly secures the space members to one another to thereby strengthen and protect the soldered joints and the thermoelectric elements from mechanical stresses. As the solid resinous material has relatively poor insulating qualities as compared to other known insulating materials, this body of resin is employed only in the space between the opposed base members or in other words is in the form of an elongated relatively narrow rectangular shape having a width approximately that of the base members. To provide the required heat insulation between the heat absorbing and heat dissipating surfaces of the module, the remaining space between these surfaces is filled with a foamed resin insulating material.

For a better understanding of the invention reference may be had to the accompanying drawing in which:

FIG. 1 is a view illustrating one step in the assembly of the module of the present invention;

FIG. 2 is a transverse view of the partly finished module illustrating the manner in which the elements are encapsulated in a rigid resinous material;

FIG. 3 is a longitudinal sectional view of a portion of a module in its finished form; and FIG. 4 is a transverse sectional view of the finished module shown in FIG. 3.

The structure and advantages of the thermoelectric module of the present invention will probably best be understood from a consideration of the various steps employed in the manufacture of the module. A plurality of P-type elements 1 and N-type thermoelectric elements 2 are alternately and series connected by means of junctions 3 and 4 so that when a direct current is passed through the assembly in one direction there will be formed for example a set of hot junctions represented by the junction forming members 3 and a set of cold junction forming members represented for example by the junction forming member 4. In this assembly, as shown in FIG. 1, the P- and N-type elements are arranged in substantially a straight line and in parallel relationship with one another. Each of the junction forming members 3 and 4 include a base portion 5 which is soldered directly to adjacent P- and N-type elements and a heat conducting portion 6 preferably terminating in a relatively large heat absorbing or heat dissipating end section 7 which, as is shown in FIG. 3 of the drawing, is in or closely adjacent a surface of the thermoelectric module.

The portion of the assembly including the thermoelectric elements 1 and 2 and the opposed surfaces of the base portion 5 joined to opposite ends of these elements as shown in FIG. 1 is thereafter embedded or encapsulated in a resinous material such as an epoxy resin or compound which cures or hardens to form a rigid resinous mass which completely encloses the thermoelectric elements 1 and 2 and rigidly secures the two sets of junction members 3 and 4 together. Since a solid resinous material has relatively poor heat insulating properties, the extent of this body 9 of encapsulating material is preferably limited, as shown in FIGS. 2 and 3, to the space between the bases 5 of the junction members 3 and 4 with the sides of the body 9 being substantially coextensive with the longitudinal edges of the base portions 5.

In order to assure adequate anchoring of the encapsulating material to the base portions 5 during the cure of the resinous material, each of the base portions 5 are preferably provided with a recess 10 extending longitudinally of the junction members. The recesses are of a size sufficient to receive the ends of the thermoelectric elements 1 and 2. The side walls 11 preferably slope inwardly or converge from the bottom to the top of the recess or in other words the recesses are wider at the bottom than at the top so that the fluid encapsulating material will flow into the recesses 10 and upon solidifying will be anchored by the converging walls 11 to the respective junction members 3 and 4. It will be understood, of course, that any suitable form or mold can be employed for limiting the encapsulating material to the above-described portions of the device.

After hardening of the encapsulating material forming the body 9, the resultant assembly as illustrated in FIG. 2 of the drawing is again placed in a suitable mold and is completely embedded in a mass of resinous foam insulation obtained by expanding in place a foamable resin mixture such as a foamable polyurethane resin. The final module may take any of a variety of shapes but will essentially include a heat dissipating surface 14 including or coextensive with the upper surface of the portions 7 of the junction members 3 and a cooling surface 15 including or coetxensive with the portions 7 of the junction forming members 4. In the illustrated embodiment of the invention the module is of rectangular cross section which is a convenient shape for assembly of a plurality of the modules to form a thermoelectric cooling device.

In the final module, it will be noted with reference to FIGS. 3 and 4 of the drawing that the heat dissipating and heat absorbing surfaces 14 and 15 are in spaced relationship and that all of the space between these surfaces other than that taken up by the thermoelectric elements, the junction forming members and the encapsulating body 9 is filled with a thermal insulating resin foam. The foam itself does not materially strengthen the module and in fact may tend to stress the soldered joints during formation of the foamed insulation by expansion of a foamable resin mixture. The desired strength and rigidity of the module is primarily obtained from the body 9 of the encapsulating material which completely surrounds and encloses the individual thermoelectric elements and which bridges and is securely anchored to the opposed base portions 5 of the junction members 3 and 4. By providing means for effectively anchoring the body 9 of resinous material to all of the junction forming members 3 and 4 comprising the module, a module of superior mechanical strength and resistance to breakage is obtained. Stresses resulting during the foaming of the resinous mass 16 or from handling of the modules during assembly thereof into a thermoelectric device are prevented from affecting both the soldered connections between the elements and the junction forming members and the elements themselves. It will be understood, of course, that depending upon the intended application of the module the surfaces 14 and 15 may be provided with a thin film of resinous insulating material in the event that the modules are to be used in contact with a metallic or other electrically conducting surface.

While there has been shown and described a particular embodiment of the present invention, it will be obvious to those skilled in the art that various changes and modifications may be made therein without departing from the invention and it is therefore intended by the appended claims to cover all such changes and modifications as fall within the true spirit and scope of the invention.

What I claim as new and desire to secure by Letters Patent of the United States is:

1. A thermoelectric module comprising spaced parallel heat absorbing and heat dissipating surfaces, a plurality of P-type and N-type elements disposed in the space between said surfaces and extending substantially perpendicular to said surfaces, said P-type and N-type elements being arranged alternately and in a substantially straight line, a plurality of junction forming members alternately and series connecting said P-type and N-type elements to form a set of hot junctions and a set of cold junctions, each of said members including a base portion connected to a P-type and an N-type element and a heat conducting portion terminating at one surface of said module, each of said base portions having a recess therein for receiving the ends of the elements connected thereto, said recess being larger than the ends of said elements, a layer of solder securing the end of each of said elements to said members within said recesses, a body of solid resinous material encapsulating all of said elements and rigidly joining all of said junction forming members together, said body of resinous material extending into said recesses and between the base portions of said junction members and being substantially coextensive with the side edges thereof, the remaining space between said surfaces being filled with a foamed resin insulating material.

2. A thermoelectric module comprising spaced parallel heat absorbing and heat dissipating surfaces, a plurality of P-type and N-type elements disposed in the space between said surfaces and extending substantially perpendicular to said surfaces, said P-type and N-type elements being arranged alternately and in a substantially straight line, a plurality of T-shaped junction forming members alternately and series connecting said P-type and N-type elements to form a set of hot junctions and a set of cold junctions, each of said members including a base portion connected to a P-type and an N-type element and a heat conducting portion terminating at one surface of said module, each of said base portions having a recess therein for receiving the ends of the elements connected thereto, said recess being larger than the ends of said elements and having converging side walls, a layer of solder securing the end of each of said elements to said members within said recesses, a body of solid resinous material encapsulating all of said elements and rigidly joining all said junction forming members together, said body of resinous material extending into said recesses and between the base portions of said junction members and being substantially coextensive therewith, the remaining space between said surfaces being filled with a foamed resin insulating material.

References Cited in the file of this patent

UNITED STATES PATENTS

| | | |
|---|---|---|
| 1,848,655 | Petrik | Mar. 8, 1932 |
| 2,626,970 | Hunrath | Jan. 27, 1953 |
| 2,947,150 | Roeder | Aug. 2, 1960 |
| 2,949,497 | Jarvis et al. | Aug. 16, 1960 |
| 2,997,514 | Roeder | Aug. 22, 1961 |